United States Patent
Hetherington et al.

(10) Patent No.: US 6,570,509 B2
(45) Date of Patent: May 27, 2003

(54) METHOD AND SYSTEM FOR ENCODING TO MITIGATE DECODING ERRORS IN A RECEIVER

(75) Inventors: Mark D. Hetherington, Crystal Lake, IL (US); Lee Michael Proctor, Cary, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/795,584

(22) Filed: Feb. 28, 2001

(65) Prior Publication Data

US 2002/0030612 A1 Mar. 14, 2002

Related U.S. Application Data

(60) Provisional application No. 60/186,819, filed on Mar. 3, 2000.

(51) Int. Cl.[7] .................................................. H03M 7/00
(52) U.S. Cl. .............................. 341/50; 341/52; 341/55; 341/61; 341/82; 341/106
(58) Field of Search ............................... 341/52, 55, 61, 341/82, 106, 118, 50–110

(56) References Cited

U.S. PATENT DOCUMENTS

| 5,003,539 A | * | 3/1991 | Takemoto et al. | .......... 714/785 |
| 5,491,700 A |   | 2/1996 | Wright et al. |   |
| 5,550,543 A | * | 8/1996 | Chen et al. | ..................... 341/94 |
| 5,600,315 A | * | 2/1997 | Shimpuku et al. | ............. 341/59 |
| 5,612,694 A | * | 3/1997 | Jedwab et al. | ................. 341/94 |
| 6,170,073 B1 | * | 1/2001 | Jarvinen et al. | ............. 714/758 |
| 6,286,122 B1 | * | 9/2001 | Alanara | ...................... 370/329 |

* cited by examiner

*Primary Examiner*—Michael Tokar
*Assistant Examiner*—Linh V Nguyen
(74) *Attorney, Agent, or Firm*—L. Bruce Terry; Steven A. May

(57) ABSTRACT

In a data transmitter having a data encoder, an encoder mode is detected. Thereafter, an excluded codeword output by the encoder operating in the encoder mode is identified. Next, a selected bit in the excluded codeword caused to have a predetermined value to produce a non-excluded codeword. Finally, the excluded codeword is substituted with the non-excluded codeword, wherein the non-excluded codeword is selected to mitigate effects of a decoding error in a receiver associated with the excluded codeword.

20 Claims, 4 Drawing Sheets

METHOD AND SYSTEM FOR ENCODING TO MITIGATE DECODING ERRORS IN A RECEIVER

CROSS REFERENCE TO RELATED APPLICATIONS

This application claims priority from U.S. application No. 60/186,819, filed Mar. 3, 2000.

FIELD OF THE INVENTION

The present invention is related in general to digital communication systems, and more particularly to a method and system for encoding data in order to avoid or mitigate decoding errors in a receiver.

BACKGROUND OF THE INVENTION

In some digital communications systems, digital samples of speech are input into a voice coder, or vocoder, to produce an encoded speech packet for transmission to a remote receiver, such as a subscriber unit in a wireless communication system. In a typical system, the speech encoder, or codec may generate one speech packet every twenty milliseconds.

For various reasons, such as increasing system capacity, the speech packet at the output of the vocoder may include a different number of bits, depending upon the operating mode of the vocoder, wherein the operating mode may be determined by speech activity. Speech activity is a means for quantifying an amount of speech in a signal. For example, actively speaking rates a higher voice activity than background noise, which typically occurs in pauses in a conversation. This variable rate speech coding is possible because it takes less data to represent background noise than active speech.

According to the specification for the Enhanced Variable Rate Codec, Speech Service Option 3 for Wideband Spread Spectrum Digital Systems, IS-127, which is used in wireless communication systems that operate in accordance with standards TIA/EIA/IS-95-A, NSI J-STD-008, or TIA/EIA/IS-2000 specifications, the voice encoding rate may be determined by comparing the current frame energy in each of two frequency bands, f(1) and f(2), to background noise estimates in these respective bands. Thresholds above the background noise in each band are determined by an estimated signal-to-noise ratio in each band. These thresholds are set for Rate 1, Rate ½, and Rate ⅛th encoding. The highest rate calculated from the two frequency bands is then selected as the encoding rate for the current frame. Other vocoder rate determination mechanisms are well known in the art.

In order to receive and reproduce the speech as it was input into the transmitter, the mobile unit, or subscriber unit, must receive, decode, and convert data back into the sound of speech. As the speech data travels through the transmission medium, which may be an air interface, errors may occur, and some data bits may be received improperly. When the data that contains errors is converted back to speech sound, the errors may cause annoying sounds that periodically interrupt the speech. These annoying sounds may be referred to as audio artifacts, and may appear as loud beeps that interrupt speech.

One cause of such audio artifacts is the mis-determination of the frame encoding rate at the subscriber unit. For example, a frame that the transmitter has coded at ⅛th rate may be decoded in the receiver as if the frame represented a data encoded at a full rate. Obviously, data encoded at ⅛th rate should be decoded at ⅛th rate, and when it is not, audio artifacts may occur. Audio artifacts may also be caused by frames being lost, bit errors going undetected, encoding or decoding quantization errors, filter overflow errors, and the like.

Thus, it should be apparent that a need exists for an improved method and system for vocoding, wherein the vocoder produces a frame of data that reduces the number of audio artifacts, or reduces the impact of the audio artifact, resulting in more desirable quality of speech at a data receiver.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF THE INVENTION

Figure 1:
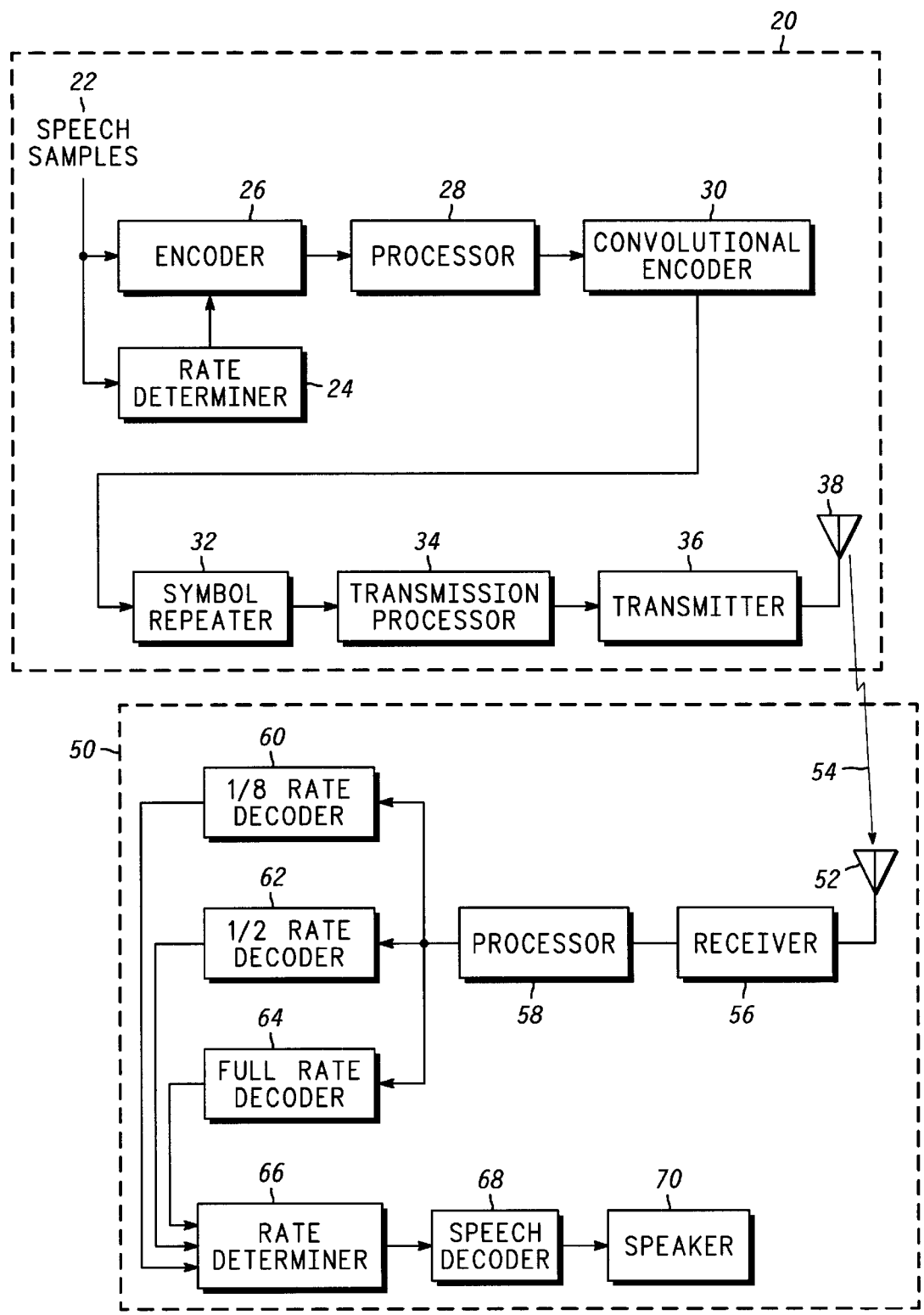
FIG. 1 is a high-level block diagram of a transmitter and receiver, wherein the transmitter includes a method and system for vocoding in accordance with the present invention.

With reference now to FIG. 1, there is depicted a high-level block diagram of a transmitter and receiver that may be used to illustrate the method and system of the present invention. As illustrated, transmitter 20 includes speech samples 22 that are input into rate determiner 24 and encoder 26. Encoder 26 is a voice encoder that is capable of operating in multiple modes, such as encoding speech samples at multiple data rates. Rate determiner 24 examines speech samples 22 and selects a mode, or encoding rate, for encoder 26.

In a preferred embodiment, encoder 26 may implement the enhanced variable rate codec (EVRC) that is described in detail in Interim Standard (IS)-127, published by the Telecommunications Industry Association (TIA)/Electronic Industry Association (EIA). As described in IS-127, the EVRC encodes speech samples at a full rate that includes 171 bits per packet, a ½ rate that includes 80 bits per packet, and a ⅛th rate that includes 16 bits per packet.

Rate determiner 24 examines speech samples 22 to determine what rate is needed to adequately recreate speech at the receiver. Rate determiner 24 may select an encoding mode based upon speech activity, which may be determined by analyzing the energy represented by speech samples 22.

Following encoder 26, processor 28 may perform further processing on data output by encoder 26 before the data is passed to convolutional encoder 30. Examples of such further processing in an IS-95 CDMA system include adding frame quality indicators, adding encoder tail bits, and the like.

Convolutional encoder 30 convolutionally encodes data output by processor 28. Convolutional encoder 30 may be implemented, as in a IS-95 communication system, by a rate ½ convolutional encoder with a constraint length equal to 9.

Following convolutional encoder 30, symbol repeater 32 repeats symbols output by convolutional encoder 30 by a number of times to keep the data rate output by symbol repeater 32 above a minimum of 9600 bits per second. Thus, when encoder 26 operates in the ⅛th frame rate mode, symbol repeater 32 has an output that is an 8 times repetition of the input symbol.

Following symbol repeater 32, transmission processor 34 may perform further data processing prior to transmitter 36. Such further processing may include block interleaving and direct sequence spreading, such as the interleaving and spreading functions performed in an IS-95 communication system.

Transmitter 36 up converts, modulates, filters, and amplifies data from transmission processor 34 so that it may be sent to a receiver. In a wireless communication system, transmitter 36 outputs a radio frequency signal for wireless transmission using antenna 38.

Receiver 50 is designed to received and demodulate signals transmitted by transmitter 20. As shown, receiver 50 includes antenna 52 for receiving signals through transmission media 54. In a wireless communication system, transmission media 54 is an air interface, which is subject to bit errors that appear in the signal received by antenna 52.

Antenna 52 is coupled to receiver 56, which demodulates and down converts the received signal to produce a digital base band signal.

The output of receiver 56 is coupled to an input of processor 58, which may perform digital signal processing, such as symbol de-spreading, soft handoff combining, de-interleaving, and de-scrambling.

Following processor 58 the receiver may need to determine the rate at which speech was encoded in transmitter 20. In many receivers, this is implemented by decoding the encoded speech at the several rates that may have been used by encoder 26. As shown in the example of data receiver 50, ⅛th rate decoder 60, ½ rate decoder 62, and full rate decoder 64 each decode data output by processor 58, and each provides such decoded data to rate determiner 66. Rate determiner 66 evaluates each of the outputs and selects data that will be passed to speech decoder 68. Rate determiner 66 also passes a control signal to speech decoder 68 SO that speech decoder 68 interprets the data and operates in the proper decoding mode.

Speech decoder 68 sends appropriate signals to speaker 70, wherein speaker 70 converts the signals to sound.

As mentioned previously, a problem with the sound created by speaker 70 may occur when rate determiner 66 mis-determines the rate at which speech decoder 68 should decode a particular packet of received speech data. For example, if rate determiner 66 determines that a speech packet has been encoded by encoder 26 at a full rate, when in fact the speech packet has been encoded by encoder 26 at ⅛th rate, speech decoder 68 may create an obnoxious sound signal, known a an audio artifact, which may be particularly annoying to the user of data receiver 50.

Rate determiner 66 may mis-determine an encoding data rate because the characteristics of a ⅛th rate frame may look confusingly similar to the characteristics associated with a full rate frame, particularly after some errors are introduced in transmission media 54. For example, rate determiner 66 may declare the rate of a speech packet based upon a symbol error rate in decoders 60–64, and a cyclic redundancy check (CRC).

Field observations have shown that during a frame when speech samples 22 represent silence, encoder 26 converge on the 16 bit codeword represented hexadecimally as 0740H. With the addition of power control puncturing in transmission processor 34, and a few bit errors introduced in transmission media 54, an embedded 12-bit CRC may pass, and a low symbol error rate (SER) may be measured, in rate determiner 66. This combination of CRC pass and low SER will result in an ⅛th rate transmission frame being declared and interpreted as a full rate frame. When speech decoder 68 is instructed to process the ⅛th rate frame as a full rate frame, speech decoder 68 may produce audio signals representing a 40 millisecond 2 kilohertz tone having an unacceptably loud volume.

In order to mitigate the effects of this decoding error, encoder 26 is prevented from outputting a set of excluded codewords when operating in a particular encoding mode.

Figure 2:
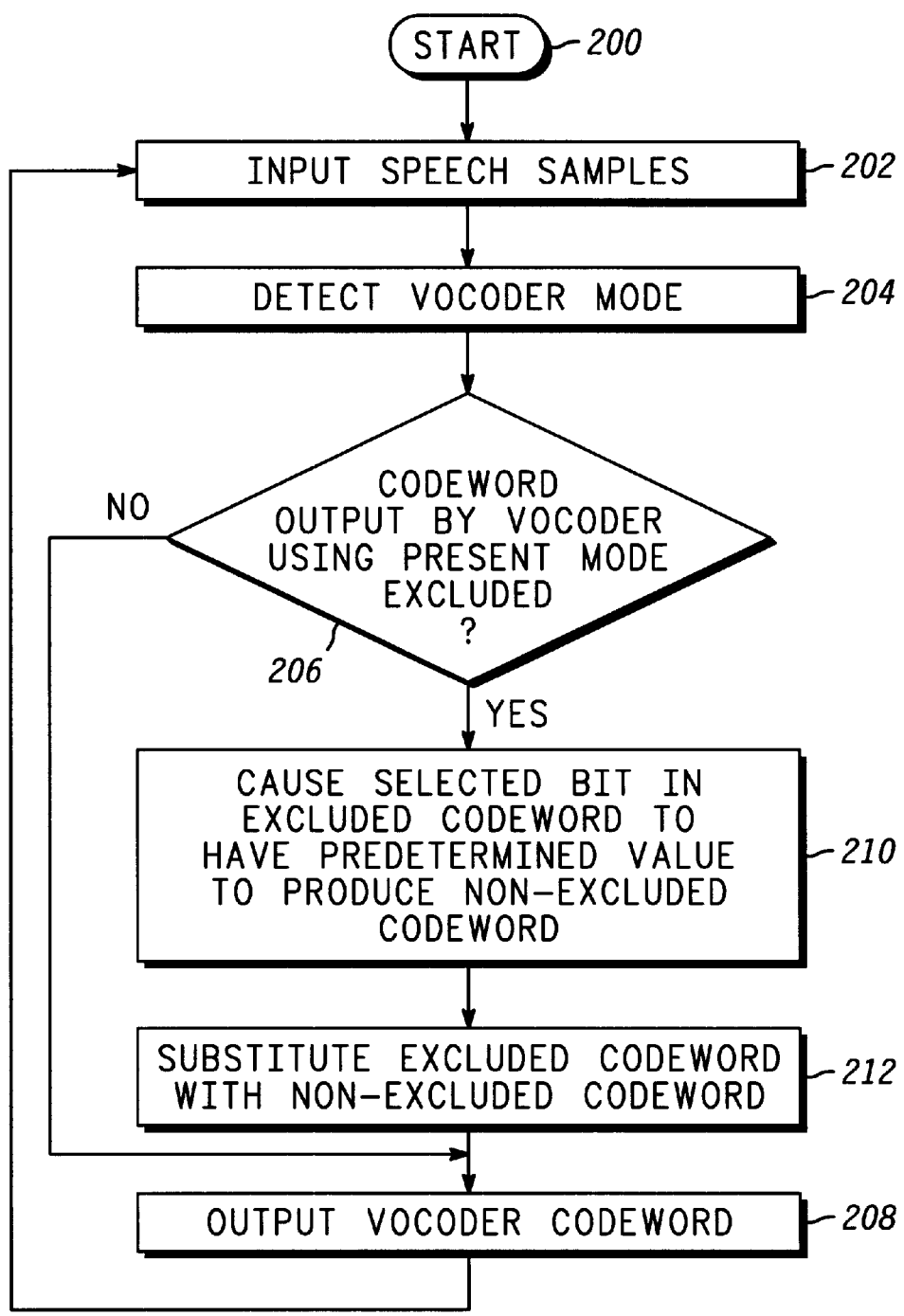
FIG. 2 is a high-level logical flow chart that illustrates the operation of vocoding in accordance with the method and system of the present invention.

Turning now to FIG. 2, there is depicted a high-level logic flow chart depicting the operation of encoding speech samples, or vocoding, in accordance with the method and system of the present invention. As illustrated, the process begins at block 200, thereafter passes to block 202 wherein speech samples are input into the vocoding function, which may include a vocoder and a rate determiner, such as encoder 26 and rate determiner 24 in FIG. 1. In an preferred embodiment, a 20 millisecond frame of speech samples taken at 8,000 samples per second is input into the vocoder.

Next, the process detects or determines the vocoder mode, as illustrated by block 204. This step may be implemented by examining the output of rate determiner 24, shown in FIG. 1. In different vocoder modes, the vocoder encodes speech samples differently, wherein different modes may produce a greater or fewer number of bits for each frame of speech samples input.

After detecting the vocoder mode, the process determines whether or not a codeword output by the vocoder using the present mode of operation is an excluded codeword, as depicted at block 206. Excluded codewords are those codewords that have been associated with decoding errors in a receiver. For example, a rate mis-determination error may cause a decoding error that produces an audio artifact in a receiver in a wireless communication system. In an preferred embodiment, these excluded codewords are ones that will produce a frame of data that is prone to, or statistically likely to, decode at the wrong decoding rate because it has a very low symbol error rate and a passing CRC. In other words, excluded codewords are those that form speech frames that are very close to speech frames properly encoded at another data rate. Other codewords may be excluded for producing frames that cause other decoding errors due to the small differences between the properly encoded frames and frames that are meant to be decoded in a different way. Excluded codewords may be empirically identified, predicted mathematically, or discovered through simulations. Excluded codewords may also be characterized by certain bits set to certain values, the existence of strings of ones or zeros, and a particular ratio of ones to zeros.

If the codeword is not an excluded codeword for the present operating mode, the vocoder function outputs the vocoder codeword, as illustrated at block 208. After outputting the codeword, the process iteratively returns to gather new speech samples, at block 202.

If, however, the codeword output by the vocoder in the present operating mode is excluded, the process causes a selected bit in the excluded codeword to have a predetermined value to produce a non-excluded codeword, as depicted at block 210.

In the step of causing selected bits to have predetermined values, the excluded codeword is adjusted to produce a non-excluded codeword that results in similar speech output at the receiver. Non-excluded codewords are selected to be more resilient to decoding errors, including rate misdetermination and other sources of significant audio artifacts.

After producing a non-excluded codeword, the process substitutes the excluded codeword with the non-excluded codeword, as illustrated at block 212. This substitution may be a simple replacement of one codeword for another, or the substitution may also involve feeding back the non-excluded codeword to the speech vocoder so that appropriate filter updates are implemented.

Following substitution of the non-excluded codeword for the excluded codeword, the non-excluded codeword is output by the vocoder, as depicted at block 208. After block 208 the process iteratively returns to block 202.

Note that blocks 210 and 212 may be implemented as a modification to the vocoder algorithm that prevents excluded codewords from being generated. Hence, the processes of identifying an excluded codewords and causing selected bits in excluded codewords to have predetermined values to produce non-excluded codewords may be implemented in a new vocoder design or algorithm.

Figure 3:
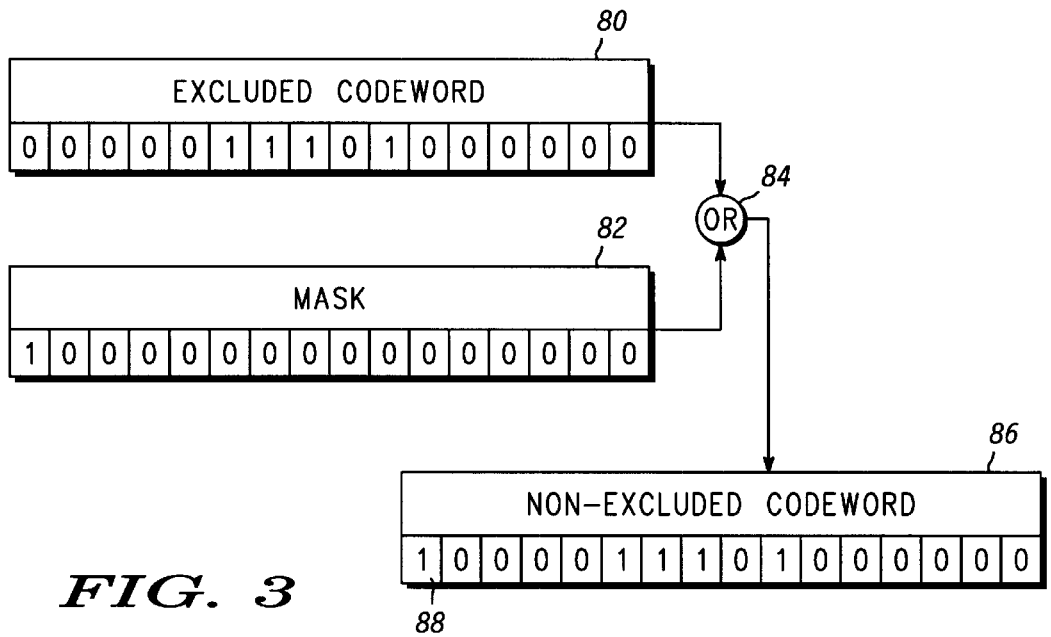
FIG. 3 further illustrates the method and system of the present invention according to a first embodiment.

Referring now to FIG. 3, there is schematically depicted a system and operation for causing a selected bit in an excluded codeword to have a predetermined value to produce a non-excluded codeword. As shown, bits in excluded codeword 80 and bits in a mask codeword 82 are input into a Boolean OR function 84, which outputs non-excluded codeword 86. Note that selected bit 88 has been caused to have the predetermined value of one.

Note that by insuring that selected bit 88, which is bit one of an ⅛th rate frame, is equal to one, there is a high probability that the mixed mode (MM) bit in an IS-95 full rate frame will be decoded as a one if the decoder erroneously causes the ⅛th rate frame to be decoded as full rate frame. In other words, by setting selected bit 88 equal to one in a non-excluded codeword, a receiver that mis-decodes the resulting frame at a full rate interprets the mixed mode bit to equal one, which tells the decoder to treat part of the frame as sub-rate speech information and another part of the frame as additional signaling or secondary information. This results in a decoding error of a false sub-rate frame which, when presented to the speech decoder, produces an audio artifact significantly less annoying than would have been produced if the frame was not interpreted in the mixed mode. Additionally, this mixed mode frame has a high probability of being discarded by the mobile due to a 16-bit CRC failure, or failure of other parameters to conform to the standard, These other parameters may include a message length parameter, a message type parameter, and a Start of Message (SOM) indicator bit. When a frame is discarded, it will not produce a decoding error.

By forcing a bit in an excluded codeword produced by a vocoder operating in a particular mode to be equal to a predetermined value, a different decoding error may be caused in the receiver, wherein the different error does not produce an audio artifact, or produces a significantly less noticeable audio artifact. In other situations, this forcing a bit to equal a predetermined value may reduce a rate of decoding errors. Other embodiments of producing non-excluded codewords may use a more intelligent approach to setting selected bits.

Figure 4:
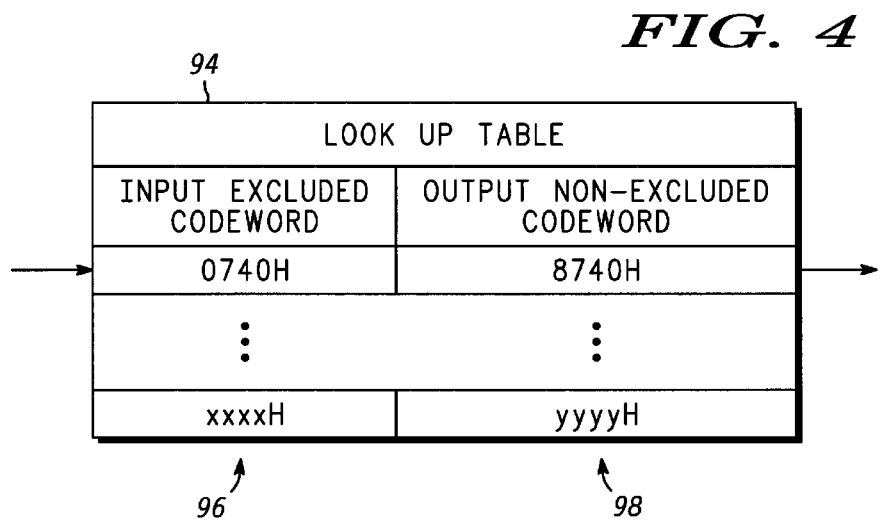
FIG. 4 further illustrates the method and system of the present invention in accordance with a second embodiment.

For example, as shown in FIG. 4, look up table 94 may be used to identify input excluded codewords 96 and substitute output non-excluded codewords 98 that are one or more bits different from the input excluded codewords. For each input excluded codeword 96, an output non-excluded codeword 98 may be selected such that the output codeword eliminates decoding errors or mitigates adverse effects of decoding errors.

Figure 5:
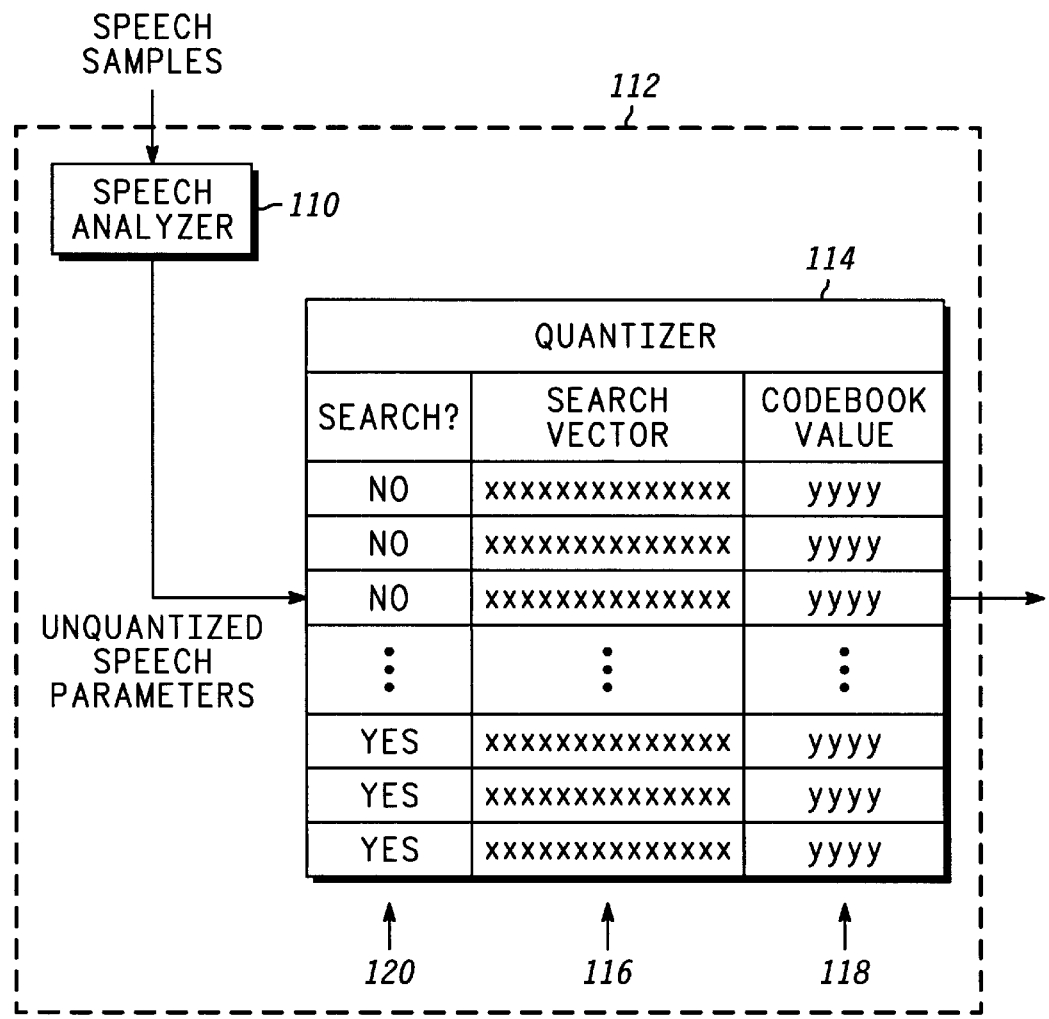
FIG. 5 further illustrates the method and system of the present invention in accordance with a third embodiment.

With reference to FIG. 5, there is depicted yet another embodiment of a method and apparatus for causing a selected bit in an excluded codeword to have a predetermined value to produce a non-excluded codeword. As shown, speech samples are input into speech analyzer 110 within speech encoder 112. Speech analyzer 110 produces parameters that are useful in describing speech, and reconstructing speech in a speech decoder. Examples of these speech parameters may include line spectral pairs that provide spectral information about the audio content of the speech samples. A further parameter, such as a frame energy vector, may provide excitation level information. These types of parameters are described in more detail in the IS-127 specification.

In order to reduce the number of bits needed to represent these unquantized speech parameters, the speech parameters output by speech analyzer 110 are input into quantizer 114. In known quantizers, input speech parameters are taken as a vector and compared with a set of search vectors in the quantizer to find the closest match. This vector matching process is also known as codebook searching, and it typically uses the Least Minimum Squared Error algorithm, as is well known in the art. Once the quantizer has identified the closest search vector, a corresponding codebook value, which has a fewer number of bits, is output.

In accordance with the present invention, quantizer 114 includes search vectors 116 and corresponding codebook values 118. Additionally, search field 120 may be used to hold a Boolean variable that permits or excludes the searching of selected search vectors, and hence permits or excludes the output of selected codebook values. By controlling which search vectors are searched, the process can control which codebook values are produced. This means that the quantizer according to the present invention forces the output of a next best codebook value that is in a set of non-excluded codewords. This next best codeword produces similar speech sounds, thus mitigating or eliminating audio artifacts due to decoding errors.

Although the present invention has been illustrated in the context of an IS-127 EVRC vocoder used in a wireless communication system, the invention may be applied to other encoders used to transmit data from a transmitter to a receiver. For example, the invention is not limited to vocoders with modes that generate full, half and eighth rate frames. Alternatively, the IS-96A standard uses a quarter rate vocoding mode. In other audio applications, audio codecs are used to represent a wide range of audio sources beyond speech.

Because the invention may reduce the number of decoding errors, and not just mitigate the effects of errors, it may also be applied to non-speech/audio applications. For example, the invention may be used in the transmission of variable rate circuit and packet data services, as described in the IS-95 and IS-2000 specifications.

The foregoing description of a preferred embodiment of the invention has been presented for the purpose of illustration and description. It is not intended to be exhaustive or to limit the invention to the precise form disclosed. Modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of producing a frame of data suitable for transmission over a communication link, the method comprising the steps of:
   determining an encoder mode of an encoder from among a plurality of encoder modes;
   determining an excluded codeword, wherein the excluded codeword is a codeword that is more likely to be subject to rate mis-determination in a receiver than other codewords; and producing a non-excluded codeword in place of the excluded codeword.

2. The method of claim 1 wherein the step of producing comprises steps of:
   determining that an output of the encoder is an excluded codeword;
   causing a selected bit in the excluded codeword to have a predetermined value to produce a non-excluded codeword; and
   substituting the excluded codeword with the non-excluded codeword.

3. The method of claim 2 wherein the step of causing a selected bit in the excluded codeword output to have a predetermined value to produce a non-excluded codeword further includes setting a selected bit in the excluded codeword output to have a predetermined value.

4. The method of claim 3 wherein the step of setting a selected bit in the excluded codeword output to have a predetermined value further includes setting a most significant bit in the excluded codeword output equal to one.

5. The method of claim 2 wherein the step of causing a selected bit in the excluded codeword output to have a predetermined value to produce a non-excluded codeword further includes selecting a predetermined, non-excluded codeword in response to the excluded codeword.

6. The method of claim 2 wherein the step of causing a selected bit in the codeword output to have a predetermined value to produce a non-excluded codeword further includes restricting a best fit codebook search in the encoder to selected codebook entries having a selected bit equal to a predetermined value.

7. The method of claim 2 wherein the step of causing a selected bit in the excluded codeword output to have a predetermined value to produce a non-excluded codeword further includes setting a selected bit in the excluded codeword output to have a predetermined value to produce a non-excluded codeword that mitigates the effects of a decoding error in a receiver associated with the excluded codeword.

8. The method of claim 1 wherein the step of producing comprises a step of restricting an output of a best fit codebook search performed by the encoder to non-excluded codewords.

9. The method of claim 1 wherein the plurality of encoder modes comprises full, half, and eight rate modes.

10. The method of claim 1 wherein the excluded codeword is hexadecimally represented as 0740H, the encoder mode is a $\frac{1}{8}^{th}$ rate encoding mode, and the non-excluded codeword is hexadecimally represented as 8740H.

11. A system for producing a frame of data suitable for transmission over a communication link, the system comprising:
    means for determining an encoder mode of an encoder from among a plurality of encoder modes;
    means for determining an excluded codeword, wherein the excluded codeword is a codeword that is more likely to be subject to rate mis-determination in a receiver than other codewords; and
    means for producing a non-excluded codeword in place of the excluded codeword.

12. The system of claim 11 wherein the means for producing comprises:
    means for determining that an output of the encoder is an excluded codeword;
    means for causing a selected bit in the excluded codeword to have a predetermined value to produce a non-excluded codeword; and
    means for substituting the excluded codeword with the non-excluded codeword.

13. The system of claim 12 wherein the means for causing a selected bit in the excluded codeword output to have a predetermined value to produce a non-excluded codeword further includes means for selecting a selected bit in the excluded codeword output to have a predetermined value.

14. The system of claim 13 wherein the means for setting a selected bit in the excluded codeword output to have a predetermined value further includes means for setting a most significant bit in the excluded codeword output equal to one.

15. The system of claim 12 wherein the means for causing a selected bit in the excluded codeword output to have a predetermined value to produce a non-excluded codeword further includes means for selecting a predetermined, non-excluded codeword in response to the excluded codeword.

16. The system of claim 12 wherein the means For causing a selected bit in the excluded codeword output to have a predetermined value to produce a non-excluded codeword further includes means for restricting a best fit codebook search in the encoder to selected codebook entries having a selected bit equal to a predetermined value.

17. The system of claim 12 wherein the means for causing a selected bit in the excluded codeword output to have a predetermined value to produce a non-excluded codeword further includes means for setting a selected bit in the excluded codeword output to have a predetermined value to produce a non-excluded codeword that mitigates the effects of a decoding error in a receiver associated with the excluded codeword.

18. The system of claim 11 wherein the means for producing comprises means for restricting an output of a best fit codebook search performed by the encoder to non-excluded codewords.

19. The system of claim 11 wherein the plurality of encoder modes comprises full, half, and eighth rate modes.

20. The system of claim 11 wherein the excluded codeword is hexadecimally represented as 0740H, the encoder mode is a $\frac{1}{8}$th rate encoding mode, and the non-excluded codeword is hexadecimally represented as 8740H.

* * * * *

UNITED STATES PATENT AND TRADEMARK OFFICE
CERTIFICATE OF CORRECTION

PATENT NO.    : 6,570,509 B1                                        Page 1 of 1
DATED         : May 27, 2003
INVENTOR(S)   : Hetherington et al.

It is certified that error appears in the above-identified patent and that said Letters Patent is hereby corrected as shown below:

<u>Column 7,</u>
Line 49, before "codeword", please insert -- excluded --.

Signed and Sealed this

Sixteenth Day of September, 2003

JAMES E. ROGAN
*Director of the United States Patent and Trademark Office*